US012366599B2

(12) United States Patent
Wong et al.

(10) Patent No.: US 12,366,599 B2
(45) Date of Patent: Jul. 22, 2025

(54) EARLY DETECTION OF DEFECTS ON SINGLE-WIRE EARTH-RETURN POWERLINES USING A LOW-VOLTAGE SENSING METHOD

(71) Applicant: DX TECH PTY LTD, Prahran (AU)

(72) Inventors: Khoi Loon Wong, Melbourne (AU); Anthony Linton Marxsen, Melbourne (AU)

(73) Assignee: DX TECH PTY LTD, Prahran (AU)

( * ) Notice: Subject to any disclaimer, the term of this patent is extended or adjusted under 35 U.S.C. 154(b) by 52 days.

(21) Appl. No.: 18/257,204

(22) PCT Filed: Dec. 11, 2021

(86) PCT No.: PCT/AU2021/051482
§ 371 (c)(1),
(2) Date: Jun. 13, 2023

(87) PCT Pub. No.: WO2022/126176
PCT Pub. Date: Jun. 23, 2022

(65) Prior Publication Data
US 2024/0044966 A1    Feb. 8, 2024

Related U.S. Application Data

(60) Provisional application No. 63/124,937, filed on Dec. 14, 2020.

(51) Int. Cl.
*G01R 31/08*    (2020.01)
(52) U.S. Cl.
CPC ......... *G01R 31/088* (2013.01); *G01R 31/086* (2013.01)

(58) Field of Classification Search
USPC ........................................... 324/512
See application file for complete search history.

(56) References Cited

U.S. PATENT DOCUMENTS

| 9,759,759 B2 * | 9/2017 | Polzer | ............ H02H 3/17 |
| 2017/0016947 A1 | 1/2017 | Polzer | |

FOREIGN PATENT DOCUMENTS

| AU | 2018214152 | 2/2019 |
| CN | 107907793 | 4/2018 |

OTHER PUBLICATIONS

Office Action for EP Application No. 21904645.5, mailed Oct. 9, 2024, 4 pages.

(Continued)

*Primary Examiner* — Farhana A Hoque
(74) *Attorney, Agent, or Firm* — DLA PIPER LLP (US)

(57) ABSTRACT

A system for locating defects on a single-wire earth-return (SWER) network can include a network, a plurality of data collection units, and a server communicably coupled to the plurality of data collection units via the network. Each data collection unit can be positioned at a distribution transformer of the SWER network and configured to measure broadband signals originating from a defect along the SWER network; convert the broadband signals to a digital signal; extract parameters from the digital signal; and transmit the extracted parameters over the network. The server can be configured to receive the extracted parameters from each of the plurality of data collection units; and determine a location of the defect based on the extracted parameters.

17 Claims, 18 Drawing Sheets

(56) References Cited

OTHER PUBLICATIONS

Examination Report No. 1 for Australian Patent Application No. 2021404408 dated Feb. 8, 2024, 3 pages.
PCT International Application No. PCT/AU21/51482, International Search Report, dated Feb. 8, 2022, 3 pages.
Office Action for CA Application No. 3,202,178, mailed Nov. 25, 2024, 5 pages.
Examination Report No. 2 for Australian Patent Application No. 2021404408 dated Jan. 28, 2025, 3 pages.
Extended European Search Report for Application No. 21904645.5 dated Mar. 24, 2025, 12 Pages.
Marxsen A.L., et al., "Internet-of-Things and Smart Sensing System for Continuous Monitoring of Powerline Network Assets," 2020 IEEE/PES Transmission and Distribution Conference and Exposition (T&D), IEEE, XP033870558, Oct. 12, 2020, pp. 1-5.
Office Action for European Patent Application No. 21904645.5, mailed Apr. 10, 2025, 1 page.
Song R., et al., "Power Quality Monitoring of Single-wire-earth-return Distribution Feeders," 2017 International Conference on High 1-4,6,7 Voltage Engineering and Power Systems (ICHVEPS), IEEE, Oct. 2-5, 2017, pp. 404-409.

\* cited by examiner

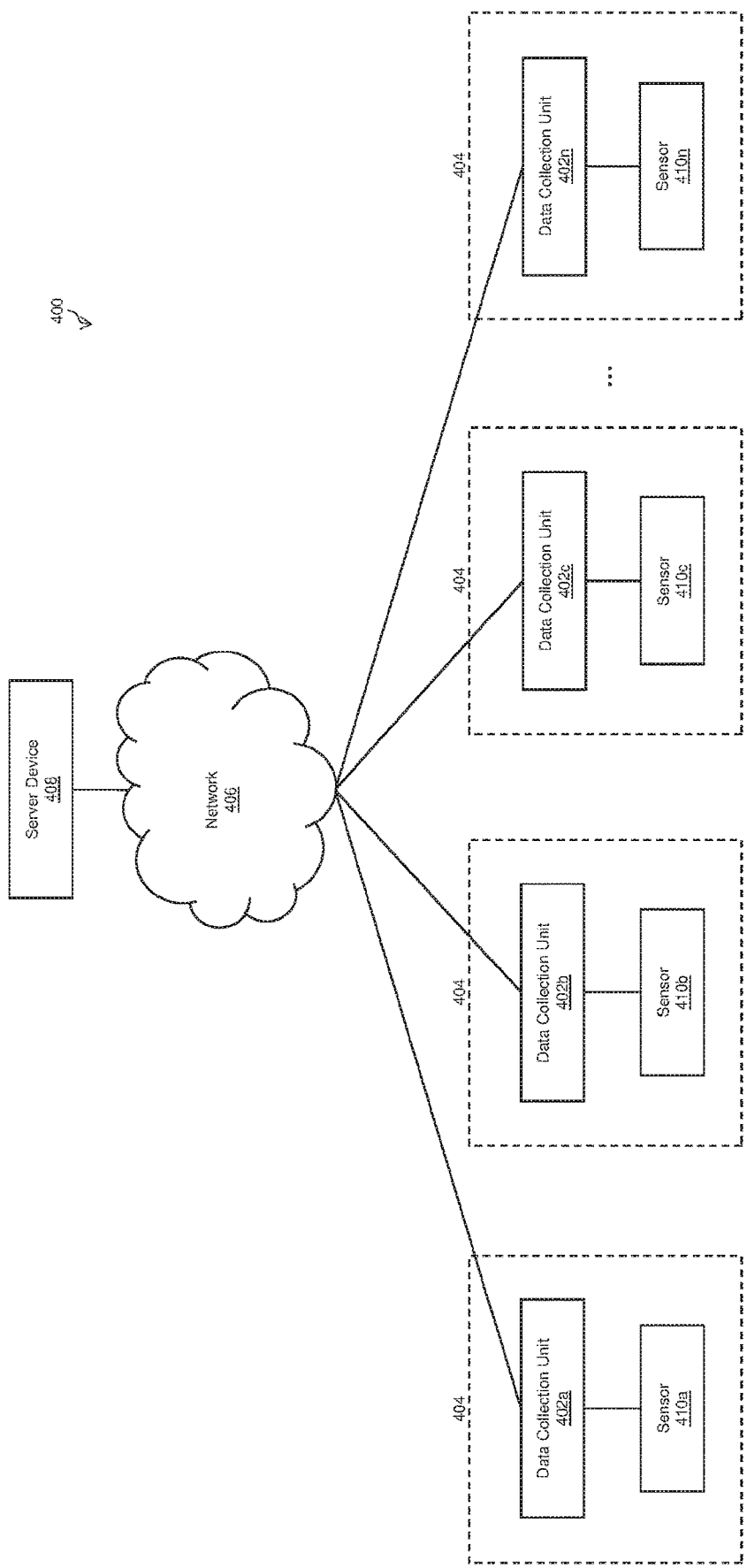

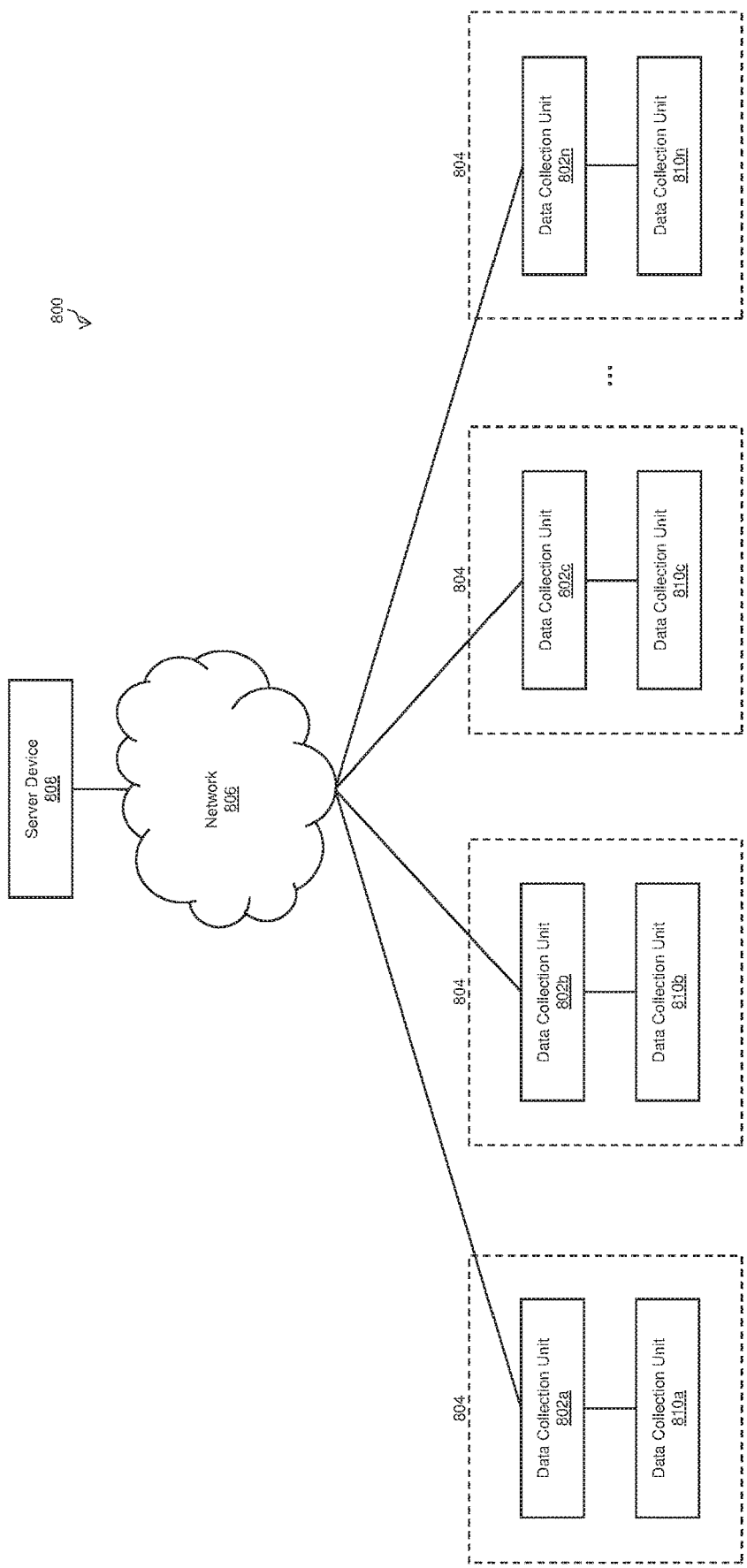

EARLY DETECTION OF DEFECTS ON SINGLE-WIRE EARTH-RETURN POWERLINES USING A LOW-VOLTAGE SENSING METHOD

CROSS-REFERENCE TO RELATED APPLICATION

This application is the National Stage filing under 35 U.S.C. 371 of International Application No. PCT/AU2021/051482, filed Dec. 11, 2021, which claims priority to U.S. Provisional Patent Application No. 63/124,937, filed on Dec. 14, 2020, which are herein incorporated by reference in their entireties.

BACKGROUND OF THE DISCLOSURE

Single-Wire Earth-Return (SWER) powerline networks can provide a low-cost, safe, and reliable supply of electricity to sparsely populated regions. Australia, New Zealand, Canada, Africa, India, Brazil, and other countries utilize SWER networks as a cost-effective way to deliver power to farms and residences in remote regions within their respective countries. For example, in Australia alone, there are more than two hundred thousand kilometers of SWER powerlines in rural areas. A SWER network typically includes a single wire to supply current and uses the earth as a current-return path. Individual loads on SWER networks are typically on the lower end (e.g., 25 kVA or less). Isolating transformers of up to 300 kVA capacity can supply power to an entire SWER network by stepping down grid voltages from, for example, 22 kV or 33 kV (i.e., line to line) to 12.7 kV or 19.1 kV (i.e., line to earth). Pole-mounted customer supply transformers at each load location (e.g., at a residence or civilian premises) then step the voltage down further to provide single-phase (e.g., 230 V or 120 V) or two-phase (e.g., 230-0-230 V or 120-0-120 V supply to customers for use within their residence or to supply remote loads.

An important advantage of SWER powerline networks is low cost. The simplicity of the systems allows for low construction and maintenance costs compared to a two-wire, three-wire, or four-wire distribution network. The simplicity also means there are fewer potential failure modes, which can result in increased reliability over polyphase powerline networks and their popularity for electrifying remote, sparsely populated regions. However, negative side effects of SWER networks can also arise. For example, the length of SWER powerlines can make fault-finding a challenge and regular asset inspection costly. Faults on SWER powerlines have started some of the deadliest fires in recent years and pre-existing asset defects are often contributing factors in wildfire ignition.

SUMMARY

According to one aspect of the present disclosure, a system for locating defects on a single-wire earth-return (SWER) network can include a network, a plurality of data collection units, and a server communicably coupled to the plurality of data collection units via the network. Each data collection unit can be positioned at a distribution transformer of the SWER network and configured to measure broadband signals originating from a defect along the SWER network; convert the broadband signals to a digital signal; extract parameters from the digital signal; and transmit the extracted parameters over the network. The server can be configured to receive the extracted parameters from each of the plurality of data collection units; and determine a location of the defect based on the extracted parameters.

In some embodiments, each of the plurality of the data collection units can be positioned on an electrical connection between a low-voltage terminal of the associated distribution transformers and a fuse box of a customer premises. In some embodiments, each of the plurality of the data collection units can be positioned immediately between two or more impedances comprising a voltage divider. In some embodiments, each of the two or more impedances can include at least one of a capacitive impedance or a resistive impedance and can include a pre-determined impedance value.

In some embodiments, the server can be configured to use a time difference of arrival (TDOA) algorithm on the extracted parameters from each of the plurality of data collection units. In some embodiments, measuring broadband signals can include measuring voltage waveforms within a frequency range of 50 Hz to 3 GHz. In some embodiments, the extracted parameters from each of the plurality of data collection units can be time-synchronized using a global positioning system (GPS) system.

According to another aspect of the present disclosure, a system for locating defects on a SWER network can include a network, a sensor configured to measure broadband signals from a first location between a distribution transformer and a customer fuse box, a data collection unit positioned at a second location between the distribution transformer and the fuse box, and a server communicably coupled to the data collection unit via the network. The signals can originate from a defect along the SWER network or in low voltage wiring of a customer premises. The data collection unit can be configured to measure broadband signals originating from the defect; convert the measured broadband signals from the first and second location to digital signals; extract parameters from the digital signals; and transmit the extracted parameters over the network. The server can be configured to receive the extracted parameters from the data collection unit; and determine whether a location of the defect is supply-side or customer-side.

In some embodiments, the data collection unit can include a first and second analog-to-digital converter (ADC); the first ADC can be configured to convert measured broadband signal from the first location and the second ADC can be configured to convert measured broadband signal from the second location. In some embodiments, measuring broadband signals can include measuring voltage waveforms within a frequency range of 50 Hz to 3 GHz. In some embodiments, the data collection unit can be positioned on an electrical connection between a low-voltage terminal of the distribution transformer and the customer fuse box.

In some embodiments, the data collection unit can be positioned immediately between two or more impedances comprising a voltage divider. In some embodiments, each of the two or more impedances can include at least one of a capacitive impedance or a resistive impedance and can include a pre-determined impedance value. In some embodiments, the sensor can include at least one of a high-frequency current transformer, a Rogowski coil, or a capacitive sensor. In some embodiments, the digital signals from the data collection unit can be time-synchronized using a global positioning system (GPS) system.

In some embodiments, the server can be configured to determine whether the location of the defect is supply-side or customer-side by comparing times of arrival from the digital signals to each of the first and second location. In some embodiments, the data collection unit can be configured to determine whether the location of the defect is supply-side or customer-side by comparing times of arrival from the digital signals to each of the first and second location. In some embodiments, comparing times of arrival from the digital signals can include determining a maximum voltage of each of the digital signals; determining a time value associated with the maximum voltage of each of the digital signals; and comparing the time values.

According to another aspect of the present disclosure, a system for locating defects on a SWER network can include a network, a first data collection unit positioned between a distribution transformer and a customer fuse box, a second data collection unit positioned on a customer side of the customer fuse box, and a server communicably coupled to the first and second data collection unit via the network. The first data collection unit can be configured to measure broadband signals from a first location originating from a defect along the SWER network or in low voltage wiring of a customer premises; convert the measured broadband signals from the first location to a first digital signal; extract first parameters from the first digital signal; and transmit the extracted first parameters over the network. The second data collection unit can be configured to measure broadband signals from a second location originating from the defect; convert the measured broadband signals from the second location to a second digital signal; extract second parameters from the second digital signal; and transmit the extracted second parameters over the network. The server can be configured to receive the first and second extracted parameters from the first and second data collection units; and determine whether a location of the defect if supply-side or customer-side.

In some embodiments, measuring broadband signals can include measuring voltage waveforms within a frequency range of 50 Hz to 3 GHz. In some embodiments, the first data collection unit can be positioned on an electrical connection between a low-voltage terminal of the distribution transformer and the customer fuse box. In some embodiments, the first and second data collection unit can each be positioned immediately between two or more impedances comprising a voltage divider. In some embodiments, each of the two or more impedances can include at least one of a capacitive impedance or a resistive impedance and can include a pre-determined impedance value.

In some embodiments, the first and second digital signals can be time-synchronized using a global positioning system (GPS) system. In some embodiments, the first and second digital signals can be time-synchronized using a direct communication link between the first and second data collection units. In some embodiments, the server can be configured to determine whether the location of the defect is supply-side or customer-side by comparing times of arrival from the first digital signal to the first location and the second digital signal to the second location.

BRIEF DESCRIPTION OF THE DRAWINGS

Various objectives, features, and advantages of the disclosed subject matter can be more fully appreciated with reference to the following detailed description of the disclosed subject matter when considered in connection with the following drawings, in which like reference numerals identify like elements.

FIGS. 4A-4C show various block diagrams of another system for detecting defects in SWER networks, according to some embodiments of the present disclosure.

FIGS. 8A-8C show various diagrams for another system for detecting defects in SWER networks, according to some embodiments of the present disclosure.

Figure 1A:
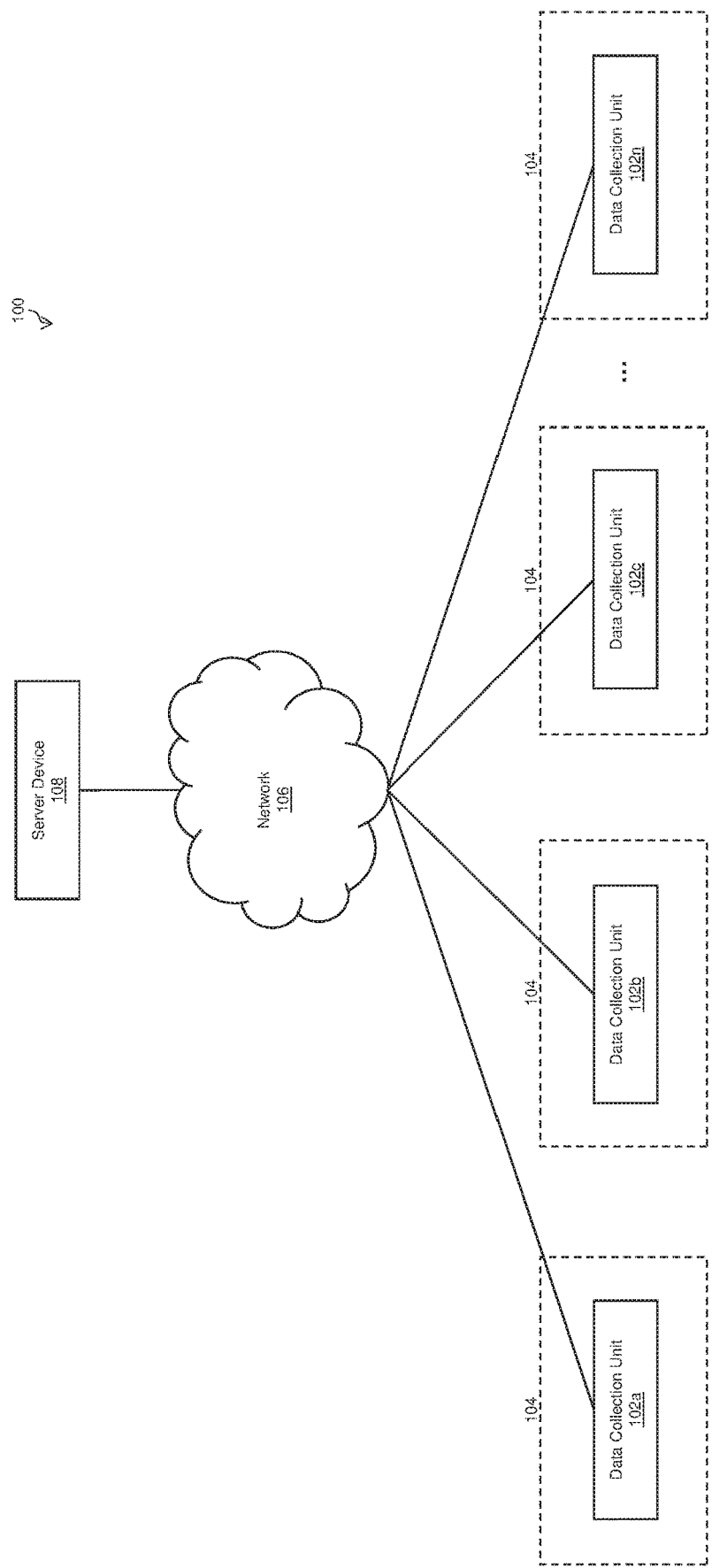
FIGS. 1A-1C show various block diagrams of a system for detecting defects in SWER networks, according to some embodiments of the present disclosure.

The drawings are not necessarily to scale, or inclusive of all elements of a system, emphasis instead generally being placed upon illustrating the concepts, structures, and techniques sought to be protected herein.

DETAILED DESCRIPTION

The following detailed description is merely exemplary in nature and is not intended to limit the invention or the applications of its use.

Embodiments of the present disclosure relate to various systems and methods for detecting defects in SWER networks, providing a low-cost solution that can continuously and remotely monitor SWER networks for early signs of asset failure. In some embodiments, the systems and methods described herein can also apply to polyphase networks. Preemptive detection of such defects can prevent customer supply outages and widespread future fire damage. In particular, the systems of the present disclosure can allow for the locating of defects in SWER networks, which can then be used to help technicians and/or maintenance personnel to preemptively fix issues before full asset failures occur that can cause fires and supply outages. As described herein, a defect can include deteriorated, damaged, or compromised network assets (e.g., by vegetation encroachment) that generate high frequency signals through mechanisms such as partial discharges, micro-arcing; surface tracking; etc. In addition, embodiments of the present disclosure can allow for a determination on whether a detected defect occurs on the customer side or the supply side of the data collection unit and corresponding alerts to be sent based on detections, such as to the owner or manager of the network.

In some embodiments, time-synchronized monitoring of high-frequency signals (e.g., between 50 Hz and 3 GHz) at the secondary (e.g., low-voltage) side of multiple single-phase distribution transformers located across a SWER network can allow system abnormalities (e.g., both high-voltage and low-voltage defects) to be detected and accurately located. For example, time-synchronized data from multiple transformers, when combined using a time-of-flight localization-determination algorithm, can be used to pinpoint potential issues in a SWER network, such as incipient asset failures or partial discharges.

In addition, the low-voltage distribution system within customer premises, dwellings, or residences can also be a source of high-frequency electrical signals. For instance, electrical arcing due to insulation failure in house wiring or defective appliances and other electrical devices can be known to generate high-frequency (HF) signals. Such HF signals can travel from the low-voltage distribution system within a building, via the low-voltage service cable, to the SWER supply step-down transformer and the high voltage SWER powerline conductors. In instances such as this, it can be valuable to be able to determine whether the source of HF signals is located on the supply side or the load side (e.g., on the high-voltage side of the SWER network or on the low-voltage distribution network within a premises).

Accordingly, embodiments of the present disclosure allow for the detection and location of incipient faults on a SWER network by measuring voltages at the low-voltage terminal of SWER transformers, as well as the determination of whether the HF signal source location is supply-side or load-side.

Figure 1B:
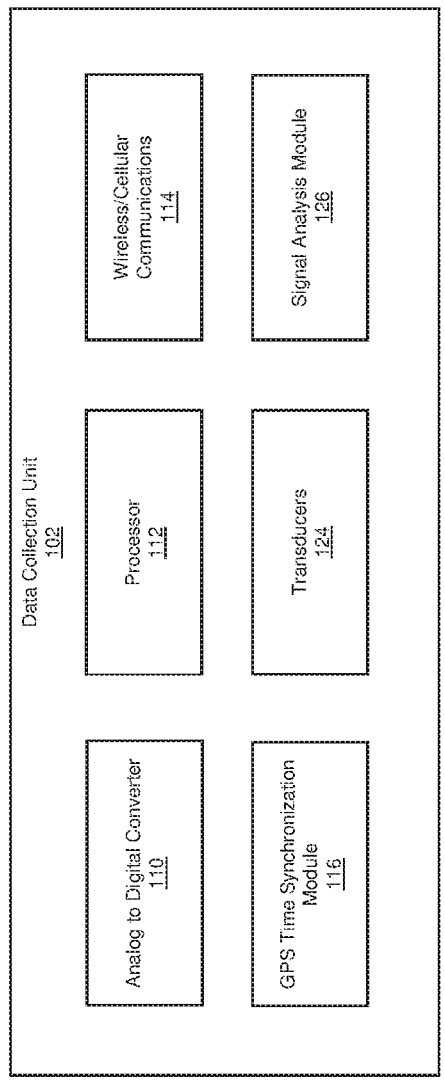
Figure 1C:
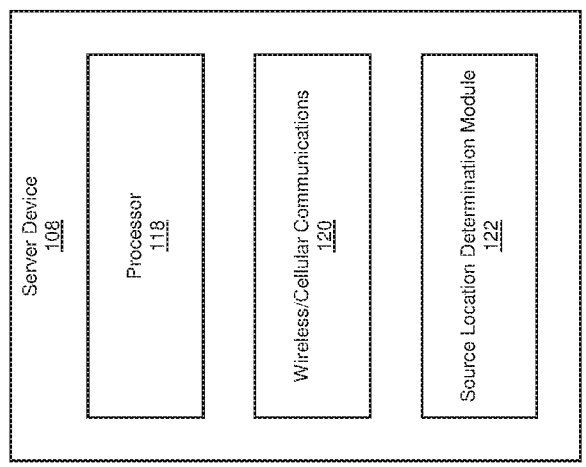

FIGS. 1A-1C show various block diagrams of a system for detecting defects in SWER networks, according to some embodiments of the present disclosure. In particular, FIG. 1A shows a system 100 that can be used to detect defects in SWER networks (SWER network is not shown). System 100 can include a plurality of data collection units 102a-n (generally referred to herein as data collection units 102) located at a plurality of premises 104; the data collection units 102 can be communicably coupled to a server device 108 via a network 106. Note, the data collection units 102 are not necessarily located inside a premises 104; rather, the pictorial representation of FIG. 1A is such that each data collection unit 102 is associated with a premises 104. As described herein, a premises can include various types of remote loads, such as residences, farm sheds, pumps, cell phone towers, etc. and is not limited to any particular type. The specific details regarding the positioning and connection of data collection units 102 is discussed in relation to FIG. 2. The premises 104 can be situated along a SWER network and the data collection units 102 can be configured to measure high frequency signals along the distribution network. The data collection units 102 can also be configured to send measurements to server device 108 over network 106. Server device 108 can utilize the received measurements from the plurality of data collection units 102 to determine a location of the source of the HF signals.

Network 106 may include one or more wide areas networks (WANs), metropolitan area networks (MANs), local area networks (LANs), personal area networks (PANs), or any combination of these networks. Network 106 may include a combination of one or more types of networks, such as Internet, intranet, Ethernet, twisted-pair, coaxial cable, fiber optic, cellular, satellite, IEEE 801.11, terrestrial, and/or other types of wired or wireless networks. Network 106 can also use standard communication technologies and/or protocols. Network 106 can include wireless internet functionality, wireless connectivity, and/or cellular functionality to facilitate wireless interconnectedness between the data collection units 102 and the server device 108.

Server device 108 may include any combination of one or more of web servers, mainframe computers, cloud-based servers, general-purpose computers, personal computers, or other types of computing devices. Server device 108 may represent distributed servers that are remotely located and communicate over a communications network, or over a dedicated network such as a local area network (LAN). Server device 108 may also include one or more back-end servers for carrying out one or more aspects of the present disclosure. In some embodiments, server device 108 may be the same as or similar to server device 1100 described below in the context of FIG. 11.

FIG. 1B is a block diagram of an example data collection unit 102 as used in system 100, according to some embodiments of the present disclosure. A data collection unit 102 can include an analog to digital converter (herein referred to as an ADC), one or more processors 112, wireless/cellular communications 114, a global positioning system (GPS) time synchronization module 116, one or more transducers 124, and a signal analysis module 126. In some embodiments, transducers 124 can include transducers such as capacitive coupling devices or high-frequency current transformers to measure and/or capture broadband signals from the channel or line it is connected to or monitoring. In some embodiments, the transducers 124 can include either connected or non-connected device to capture signals from high-voltage and low voltage lines and cables. In some embodiments, the ADC 110 can be configured to convert analog voltage and/or current measurements from the transducers 124 to a digital number or plot of digital numbers, which can then be used for analysis; this can herein be referred to as "digitizing" signals or waveforms. In addition, the GPS time synchronization module 116 can be configured to synchronize all captured signals. For example, the GPS time synchronization module 116 can be configured to time-synchronize the captured broadband signals in accordance with other data collection units 102 being utilized in the system 100. This allows for consistent comparison and analysis of the various captured signals from the various data collection units 102. Signal analysis module 126 can be configured to, via the processor 112, extract various parameters from the digitized signals. In some embodiments, these parameters can include the arrival time and peak magnitude of the original signal detected by the transducer, a frequency-time signature of the signal, and a measurement that reflects detection quality. Wireless/cellular communications functionality 114 can be configured to, via instructions from the processor 112, transmit wireless signals to the server 108. For example, the wireless signals can include the parameters determined by the signal analysis module 126 that describe the captured broadband signals FIG. 1C is a block diagram of an example server device 108 as used in system 100, according to some embodiments of the present disclosure. Server device 108 can include one or more processors 118 (e.g., either physical or virtual servers), wireless/cellular communications functionality 120, and a source location determination module 122. Wireless/cellular communications functionality 120 can be configured to receive signals from the plurality of data collection units 102. The received signals can include time-synchronized broadband data (e.g., high-frequency voltage waveforms or the key parameters thereof) measured by each of the data collection units 102. In some embodiments, source location determination module 122 can be configured to, via the one or more processors 118, calculate the location of a signal by employing a time-difference of arrival (TDOA) algorithm on the received broadband signal data from two or more data collection units 102. Because the location of each of the data collection units 102 is known by the server 108 and the captured broadband signals from each of the data collection units 102 are all time-synchronized, this allows the server 108 to triangulate a position as the source of the signal along the wire. In some embodiments, because the analysis is done along a SWER transmission line, using broadband signals from two data collection units 102 can provide sufficient accuracy. In some embodiments, in response to determining the source of a location, the server 108 can be configured to generate various notifications to connected devices that can indicate the determined locations to technicians and other maintenance personnel. In some embodiments, notifications can include email and/or SMS messages to nominated parties on behalf of the monitored networks.

Figure 2:
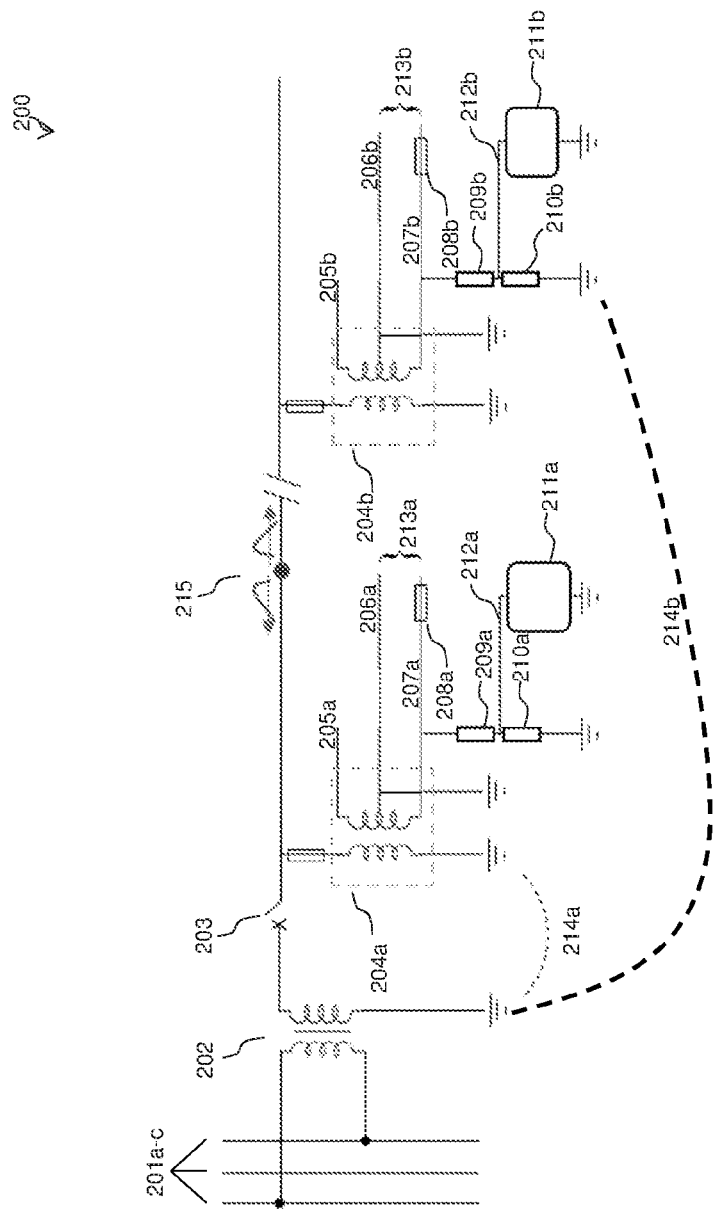
FIG. 2 shows an example circuit schematic of a system for detecting defects in SWER networks, according to some embodiments of the present disclosure.

FIG. 2 shows an example circuit schematic 200 of system 100 for detecting defects in SWER networks, according to some embodiments of the present disclosure. Circuit 200 provides a schematic of a SWER network, various premises that receive electrical power from the SWER network, and data collection units of the present disclosure. Circuit 200 can include voltage lines 201a-c that provide power to the entire circuit 200. For example, the voltage between lines 201a and 201c can provide the potential difference that induces a current to supply the network, such as 22 kV or 33 kV. Circuit 200 can also include an isolating transformer 202 that is configured to step down the voltage from lines 201a-c. In some embodiments, the transformer 202 can step down the voltage to either 19.1 kV or 12.7 kV. In some embodiments, the transformer 202 can have a capacity of up to 300 kVA. Note, these values are not limiting and are merely exemplary in nature based on standard grid-supply voltage levels as used throughout the world. Circuit 200 can also include a switch/breaker 203 that can be used to prevent damage to electrical components in the event of surges in current or other similar events.

After the voltage is stepped down by the isolating transformer 202, the current travels along SWER network powerlines until it reaches various residences and premises and is stepped down again. For example, each SWER distribution transformer 204 (e.g., distribution transformers 204a-b) can be located at or near a premises 213 and can be configured to step down the voltage to various levels for customer supply (e.g., a single-phase or double-phase supply), such as three levels 205, 206, and 207. In some embodiments, levels 205a-b can be nominally 240 V, levels 206a-b can be 0 V, and levels 207a-b can be nominally 240 V. In some embodiments, levels 205a-b can be nominally 120 V, levels 206a-b can be 0 V, and levels 207a-b can be nominally 120 V. Circuit 200 can also include customer fuse boxes 208a-b at each premises 213a-b that can separate incoming voltage from the SWER distribution network into various circuits for use in appliances and equipment around the premises 213. In some embodiments, the fuse box 208 can also be configured to stop electricity in case of overload or short-circuit of the system. To complete the circuit from each distribution transformer 204 with the initial isolating transformer 202, the circuit 200 can include earth return paths 214a-b (214 generally), as is characteristic of a SWER network. Note, earth return path 214 can represent all earth return paths from various premises. It is important to note that circuit 200 is not drawn to scale and that the physical distance between premises 213a and 213b, and thus distribution transformers 204a-b, can be any distance up to around ten miles.

In some embodiments, the circuit 200 can also include impedances 209 and 210 and a data collection unit 211 at each premises. The data collection unit 211 can be the same as or similar to the data collection unit 102 of FIGS. 1A-1B and various data collection units 211 can be installed at residences, premises, or other buildings along the SWER distribution network within circuit 200. The data collection unit 211 can be installed on the electrical connection between the low-voltage terminal of a distribution transformer 204 and the customer fuse box 208. In some embodiments, this placement can be referred to as being installed on the "supply-side" of a customer's electricity meter. In some embodiments, the data collection unit 211 can be configured to, as described above in relation to FIGS. 1A-1B, capture broadband signals via channels 212a-b in a frequency range of 50 Hz to 3 GHz. The data collection units 211 can also be configured to time-synchronize the captured signals. In some embodiments, the data collection unit 211 can include impedances 209 and 210, although they are shown separately in FIG. 2 for clarity of illustration. In some embodiments, impedances 209 and 210 can be capacitive or resistive and each can have pre-determined impedance values. Impedances 209 and 210 can be used to reduce the magnitude of the voltage for measuring purposes and create reference voltages. In some embodiments, impedances 209 and 210 can also be used as signal filters or attenuators.

The placement and installation of various data collection units 211 at various premises along a SWER network can allow for the location of detected defects. For example, a defect 215 could occur at a point along the SWER distribution network between two distribution transformers 204a and 204b, and thus between two premises. In some embodiments, the distance between two premises can be several miles. The HF signals generated by the defect 215 can travel both left and right in the circuit 200 from 215, through the distribution transformers 204a and 204b and be detected by each of data collection units 211a and 211b. The data collection units 211a-b, because of the coordinated time-synchronization, can send their data about the captured HF signal from the defect 215 to a central server, such as server device 108 of FIGS. 1A and 1C. The server can analyze the received data using a TDOA algorithm to determine a location of the defect 215. For example, if data collection unit 211a detects the HF signal at an earlier time than the data collection unit 211b, then the location of the defect 215 would be closer along the SWER network to data collection unit 211a than 211b. The server is configured to analyze these time values quantitatively using a TDOA algorithm to quantitatively determine the location of the source.

Figure 3:
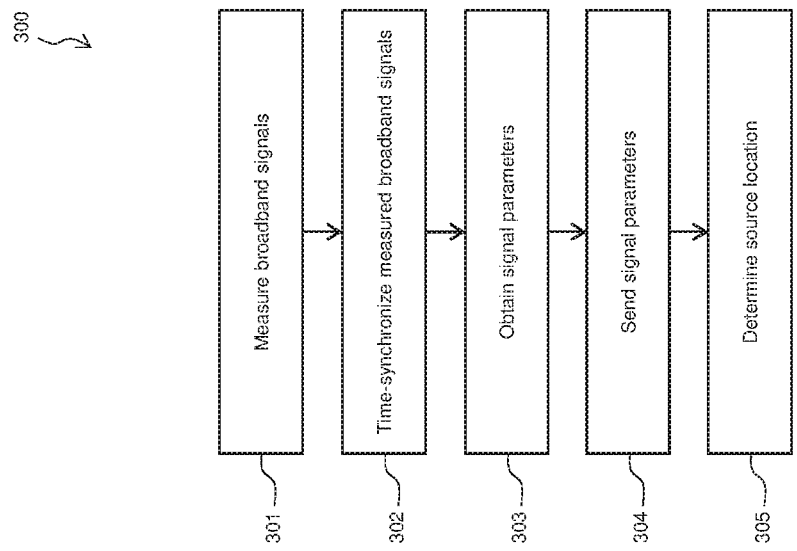
FIG. 3 is a flow diagram showing example processing that may occur to detect defects in SWER networks, according to some embodiments of the present disclosure.

FIG. 3 is a flow diagram showing an example process 300 that may occur within circuit 200 and system 100 to detect defects in SWER networks, according to some embodiments of the present disclosure. At block 301, a plurality of data collection units (e.g., data collection units 211 of FIG. 2 and/or data collection units 102 of FIG. 1) can measure HF broadband signals. In some embodiments, the plurality of data collection units 211 can include two or more data collection units 211 and each can be configured to measure broadband signals along the electrical connection of the SWER network with a frequency between 50 Hz and 3 GHz. In some embodiments, each of the plurality of data collection units 211 can be positioned between the low-voltage terminal of a SWER distribution transformer (e.g., distribution transformer 204 of FIG. 2) and a customer's service fuse box at a premises (e.g., fuse box 208). In other words, the data collection units 211 can be positioned on the supply-side of electricity meters at a plurality of customer premises.

At block 302, each of the data collection units 211 can time-synchronize the respective measured broadband signals. For example, each data collection unit 211 may utilize the internal GPS time synchronization module 116 as executed by the processor 112. At block 303, each data collection unit 211 can obtain or extract various parameters from the time-synchronized signals, such as via signal analysis module 126. At block 304, each data collection unit 211 can send the respective parameters to a server, such as server device 108 of FIGS. 1A and 1C. At block 305, server device 108 can determine the source location of the HF signals by performing a TDOA algorithm on the received parameters, such as with the source location determination module 122 of FIG. 1C.

Figure 4B:
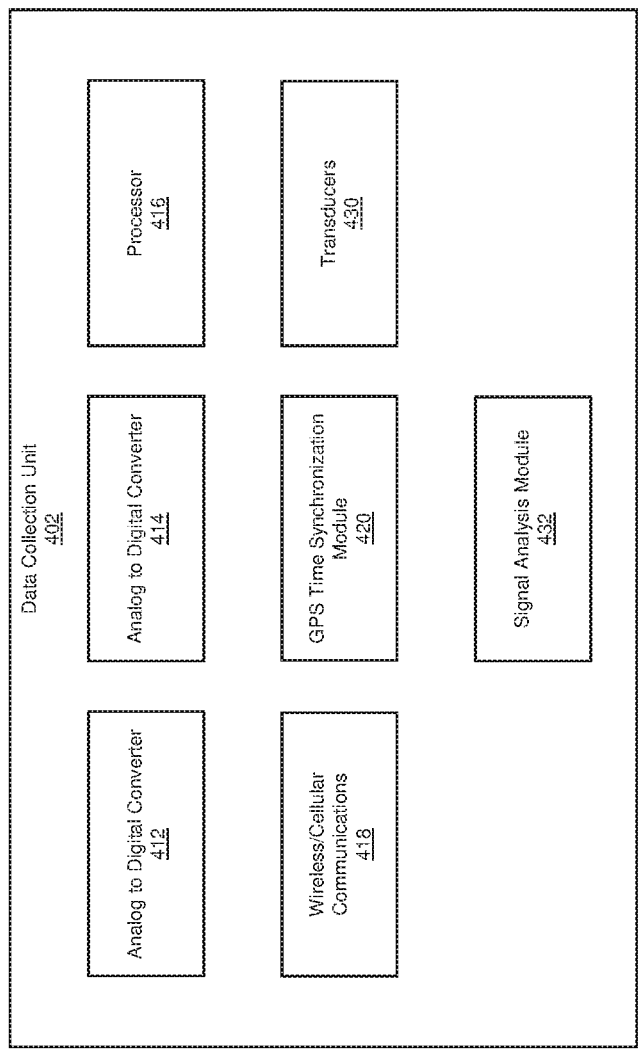
Figure 4C:
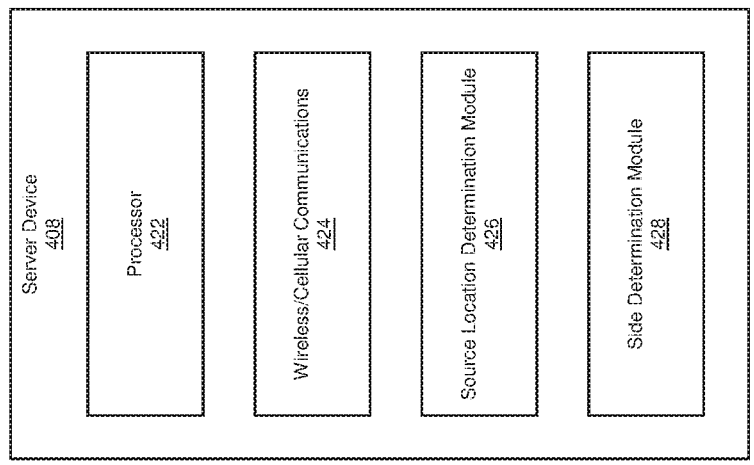

FIGS. 4A-4C show various block diagrams of another system for detecting defects in SWER networks, according to some embodiments of the present disclosure. In particular, FIG. 4A shows a system 400 that can be used to detect defects in SWER networks (SWER network is not shown). Similar to system 100, system 400 can include a plurality of data collection units 402a-n associated with a plurality of premises 404. The data collection units 402 can be communicably coupled to a server device 408 via a network 406. Note, the difference between system 100 of FIG. 1A and system 400 is that system 400 includes additional sensors 410a-n, wherein each sensor 410 is connected to and associated with a data collection unit 402. Data collection units 402 can be the same as or similar to the data collection units 102 of FIGS. 1A and 1B. Details on the specific positioning of data collection units 402 and sensors 410 is described in FIG. 5.

FIG. 4B is a block diagram of an example data collection unit 402 as used in system 400, according to some embodiments of the present disclosure. Data collection unit 402 can be similar to the data collection unit 102 of FIGS. 1A and 1B in that it includes an ADC 412, one or more processors 416, wireless/cellular communications functionality 418, a GPS time synchronization module 420, one or more transducers 430, and a signal analysis module 432. However, data collection unit 402 includes an additional ADC 414. In some embodiments, a second ADC 414 can allow for the detection of which side a defect source originates from (e.g., supply-side or customer side, as further described below).

FIG. 4C is a block diagram of an example server device 408 as used in system 400, according to some embodiments of the present disclosure. Server device 408 can be similar to the server device 108 of FIGS. 1A and 1C in that it includes one or more processors 422, wireless/cellular communications functionality 424, and a source location determination module 426. However, server device 408 also includes a side determination module 428. The side determination module 428 can be configured to determine whether an HF signal source is located at the customer side or the supply side of a SWER network.

In an alternate embodiment, the side determination module 428 can be contained within the data collection unit 402 instead of server 408. In such an embodiment, the analysis of the times of arrival and subsequent comparison can be performed at the data collection unit 402 via the respective processor 416. The results of the comparison and analysis could then be transmitted to the server 408 via wireless/cellular communications 418. From there, the server 408 could generate various notifications and alerts as described herein.

Figure 5:
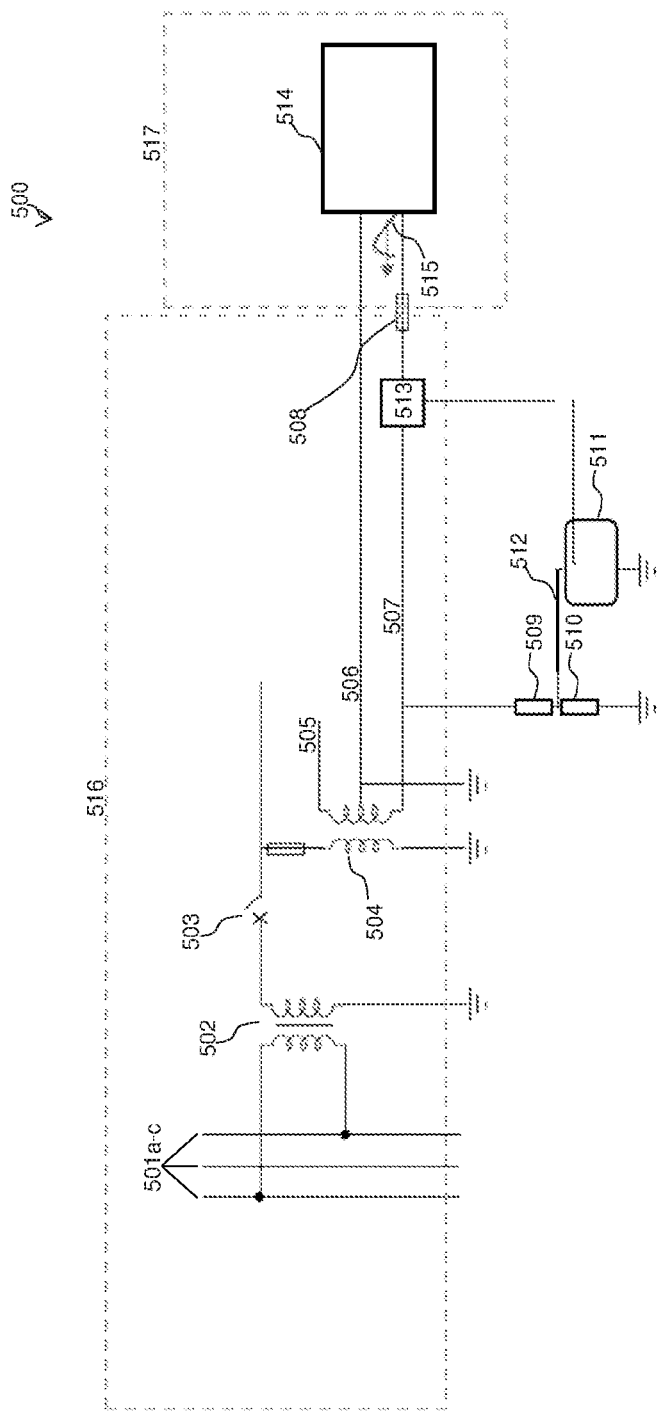
FIG. 5 shows another example circuit schematic of a system for detecting defects in SWER networks, according to some embodiments of the present disclosure.

FIG. 5 shows another example circuit schematic 500 of a system for detecting defects in SWER networks, according to some embodiments of the present disclosure. Similar to circuit 200 of FIG. 2, circuit 500 provides a schematic of a SWER network, various premises that receive electrical power from the SWER network, and data collection units of the present disclosure. Within circuit 500, section 516 is considered the supply side and section 517 is considered the customer side. Circuit 500 can include voltage lines 501a-c that provide power to the entire circuit 500. The provided voltage can be stepped down by isolating transformers 502; the circuit 500 can also include a switch or circuit breaker 503 as a safeguard. To provide electrical power to a premises 514, a distribution transformer 504 is configured to further step down the voltage to usable levels 505-507 for appliances and other electronics within the premises 514. A customer fuse box 508 can separate incoming voltage from the SWER distribution network into various circuits.

In addition, similar to the data collection unit 211 of circuit 200, data collection unit 511 can be installed on the electrical connection between the low-voltage terminal of a distribution transformer 504 and the customer fuse box 508, which is on the supply side 516. Similar to data collection unit 211, data collection unit 511 can be configured to capture broadband signals via channel 512 in a frequency range of 50 Hz to 3 GHz. The data collection unit 511 can also be configured to time-synchronize the captured signals. In some embodiments, the data collection unit 511 can include impedances 509 and 510. In some embodiments, impedances 509 and 510 can be capacitive or resistive and each can have pre-determined impedance values. Impedances 509 and 510 can be used to reduce the magnitude of the voltage for measuring purposes and create reference voltages. In some embodiments, impedances can also be used as signal filters or attenuators.

In some embodiments, circuit 500 can also include a sensor 513 that is installed on the low-voltage or secondary service cable to the premises 514. In some embodiments, the sensor 513 can be a high-frequency current transformer, a Rogowski coil, or a capacitive sensor. In some embodiments, data collection unit 511, as described in FIG. 4B, can include two ADCs (e.g., ADC 412 and ADC 414). In some embodiments, one of the ADCs can be configured to convert analog voltage and/or current measurements as captured by the voltage divider 509-510 to a digital number or plot of digital numbers. In addition, the other ADC can be configured to convert analog voltage and/or current measurements as captured by the sensor 513 to a digital number or plot of digital numbers. In addition, the GPS time synchronization module 420 can then time-synchronize the captured broadband signals.

The placement and installation of the sensor 513 and the data collection unit 511 can allow for the determination of whether the source of a defect's HF signal is located on the supply side or the customer side. For example, a defect 515 could occur at a point near or within the premises 514, on the customer side of the circuit 500. The HF signals generated by the defect 515 can travel through the fuse box 508 and be detected by the sensor 513, as well as by the voltage divider 509-510 of the data collection unit 511. The data collection unit 511 can receive the measurements from the sensor 513, convert all broadband measurements to a digital format using the associated ADCs, time-synchronize the measurements, extract the relevant parameters as described herein, and send to a central server for analysis. The server can also compare the times of arrival of the HF signals. Because of the placement of the sensor 513 and the data collection unit 511, analysis of the time of arrival to each can be used to determine whether the source is located on the supply side or the customer side. For example, in the case of defect 515, because it is on the customer side 517, the generated HF signals can reach and be detected by the sensor 513 prior to data collection unit 511. This is further described below in FIG. 6. In an alternate embodiment, the analysis of the times of arrival and their comparisons can be performed by the data collection unit 511 itself, rather than the server.

Figure 6:
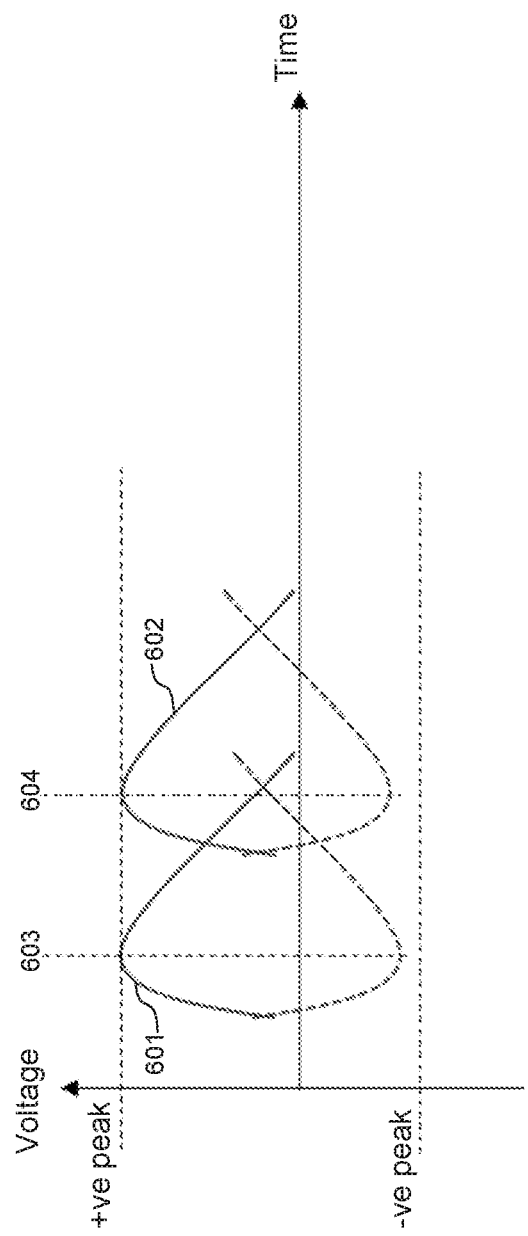
FIG. 6 shows example signals captured by the system of FIG. 4A, according to some embodiments of the present disclosure.

FIG. 6 shows example signals captured by the system of FIG. 4A, according to some embodiments of the present disclosure. A data collection unit 511 (e.g., via a signal analysis module 432) cancan analyze the time-synchronized broadband signals as measured by both the data collection unit 511 and the sensor 513. The data collection unit 511 can be configured to determine a maximum voltage of each of the received signals and the time value associated with the maximum voltage and send these parameters to a server, such as server 408. From there, the server can compare the time values (e.g., the times of arrival) to determine whether the source is located on the supply side 516 or the customer side 517. In FIG. 6, curve 601 can be the signal as measured by the sensor 513, while curve 602 can be the signal as measured by data collection unit 511 (e.g., by one or more transducers such as transducers 430). Time value 603 can correspond to the voltage peak of curve 601 and time value 604 can correspond to the voltage peak of curve 602. Because time value 603 occurs earlier than time value 604, this suggests that the source of the defect is located on the customer side 517. In some embodiments, more complex signal processing methods are used to determine the arrival time of the measured signal rather than detection of the voltage peak.

In some embodiments, however, the data collection unit 511 could also be configured to send the full broadband signal or waveform (synchronized or unsynchronized) to the server for various types of analysis. For example, an employee or other person monitoring the network may wish to perform an in-depth manual investigation of the broadband signals and not just the extracted parameters.

Figure 7:
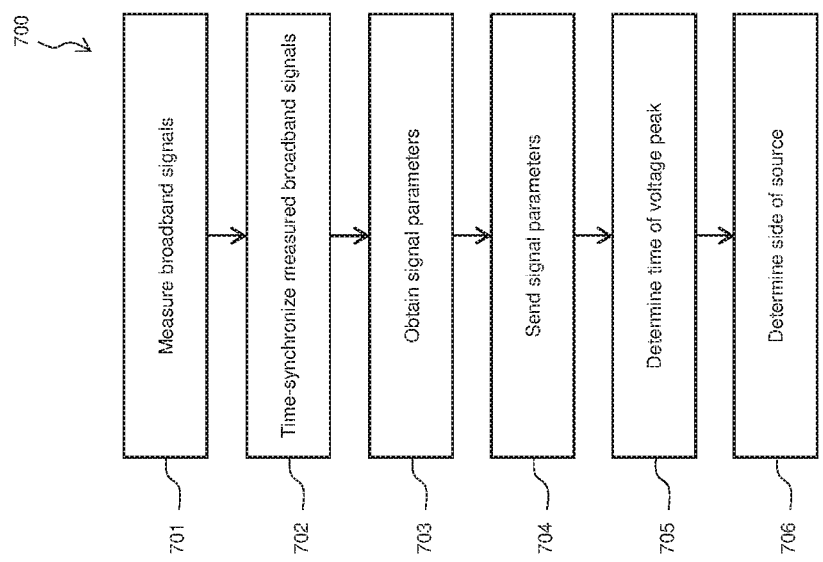
FIG. 7 is another flow diagram showing example processing that may occur to detect defects in SWER networks, according to some embodiments of the present disclosure.

FIG. 7 is another flow diagram showing an example process 700 that may occur to detect defects in SWER networks, according to some embodiments of the present disclosure. At block 701, a data collection unit, such as data collection unit 511 of circuit 500, can measure HF broadband signals that originate from a defect. In some embodiments, a sensor, such as sensor 513, can also measure HF signals from the same defect. Data collection unit 511 can be configured to receive the measurements and convert all the measurements to a digital format using two ADCs 412 and 414. In some embodiments, the measurements can be of signals between frequencies of 50 Hz and 3 GHz. As described in circuit 500, the data collection unit can be positioned between the low-voltage terminal of a SWER distribution transformer (e.g., distribution transformer 504 of FIG. 5) and a customer's service fuse box at a premises (e.g., fuse box 508) and the sensor 513 can be positioned on the low-voltage or secondary service cable to the premises 514. At block 702, data collection unit 511 can time-synchronize the measured broadband signals collected from the SWER network. For example, each data collection unit 511 may utilize the internal GPS time synchronization module 420 as executed by the processor 416. At block 703, the data collection unit 511 can obtain or extract various signal parameters from the synchronized broadband signals as described herein. At block 704, the data collection unit 511 can send the obtained signal parameters to a server, such as server device 408 of FIGS. 4A and 4C. At block 705, server 408 can determine the time of the voltage peak of each of the received broadband signals, such as in FIG. 6). At block 706, server 408 can, via the side determination module 428, determine the side that the source is located on by comparing the time values of the associated voltage peaks. In an alternate embodiment, the order of blocks 704 and 705 could be switched. For example, the data collection unit 511 could determine the times of the voltage peaks. From here, the data collection unit 511 can send the determined signal parameters, including the determined voltage peak time values, to the server 408, which can determine the side of the source based on the received parameters. In yet another embodiment, the data collection unit 511 can also perform the source side determination step without sending any parameters to the server. In some embodiments, the server 408 can be configured to apply correction factors to correct the time of signal peak for errors (e.g., errors in the GPS time-synchronization).

Figure 8B:
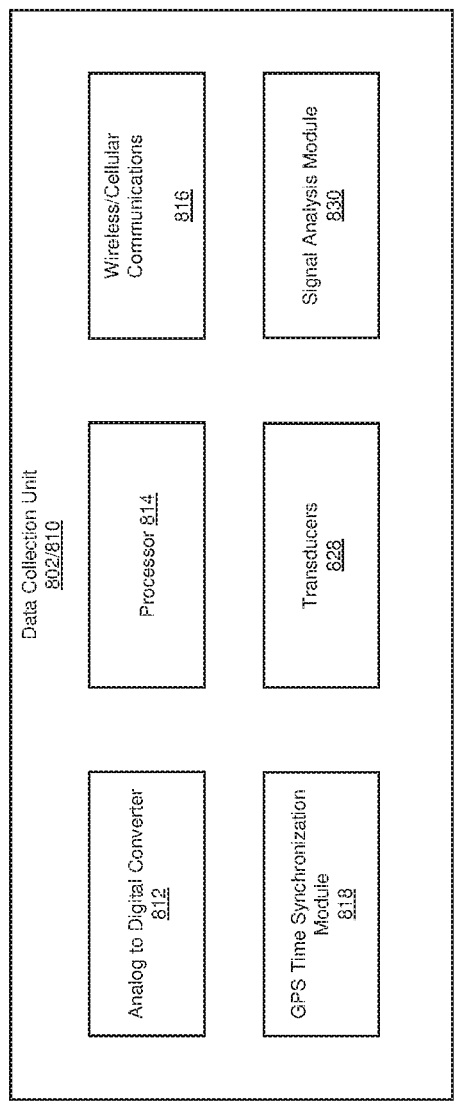
Figure 8C:
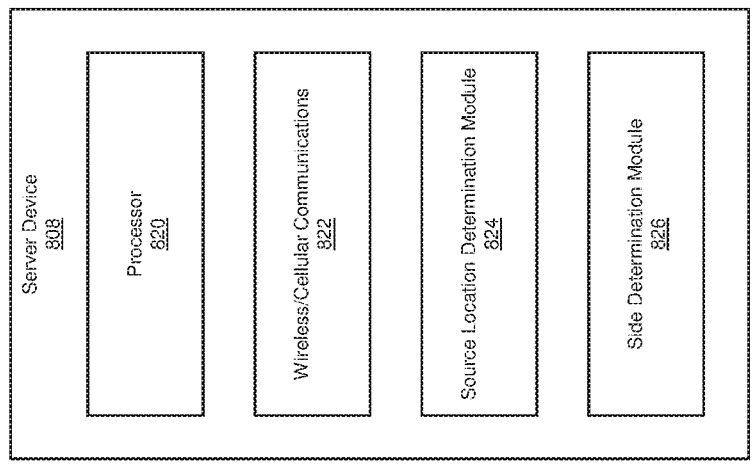

FIGS. 8A-8C show various diagrams for another system for detecting defects in SWER networks, according to some embodiments of the present disclosure. In particular, FIG. 8A shows a system 800 that can be used to detect defects in SWER networks (the SWER network is not shown). System 800 can be an alternate embodiment of system 400. For example, similar to system 400, system 800 can include a plurality of data collection units 802*a-n* associated with a plurality of premises 804. The data collection units 802 can be communicably coupled to a server device 808 via a network 806. In addition, the difference between system 400 of FIG. 4A and system 800 is that system 800 includes additional data collection units 810*a-n* instead of sensors 410*a-n*, wherein each data collection unit 810 is associated with the same premises as data collection units 802. Data collection units 802 can be the same as or similar to the data collection units 102 of FIGS. 1A and 1B. Details on the specific positioning of data collection units 802 and 810 is described in FIG. 9. In some embodiments, the two data collection units at a premises (e.g., data collection units 802*c* and 810*c*) may or may not directly communicate with each other. For example, they may independently send respective signal information to a server. Alternatively, they may directly exchange information to perform the side determination locally using their internal processors.

FIG. 8B is a block diagram of an example data collection unit 802 or 810 as used in system 800, according to some embodiments of the present disclosure. Data collection units 802 and 810 can be similar to or the same as the data collection unit 102 of FIGS. 1A and 1B in that it includes an ADC 812, one or more processors 814, wireless/cellular communications functionality 816, a GPS time synchronization module 818, one or more transducers 828, and a signal analysis module 830.

FIG. 8C is a block diagram of an example server device 808 as used in system 800, according to some embodiments of the present disclosure. Server device 808 can be similar to or the same as the server device 408 of FIGS. 4A and 4C in that it includes one or more processors 820, wireless/cellular communications functionality 822, a source location determination module 824, and a side determination module 826. The side determination module 826 can be configured to determine whether an HF signal source is located at the customer side or the supply side of a SWER network point of customer supply.

Similar to as described with respect to FIGS. 4B-4C, in some embodiments, side determination module 826 can reside within a data collection unit (e.g., data collection unit 802 and/or 810) rather than the server 808. In such an embodiment, the analysis of the times of arrival and subsequent comparison can be performed at the data collection unit 802 and/or 810 via the respective processors. The results of the comparison and analysis could then be transmitted to the server 808 via respective wireless/cellular communications. From there, the server 808 could generate various notifications and alerts as described herein.

Figure 9:
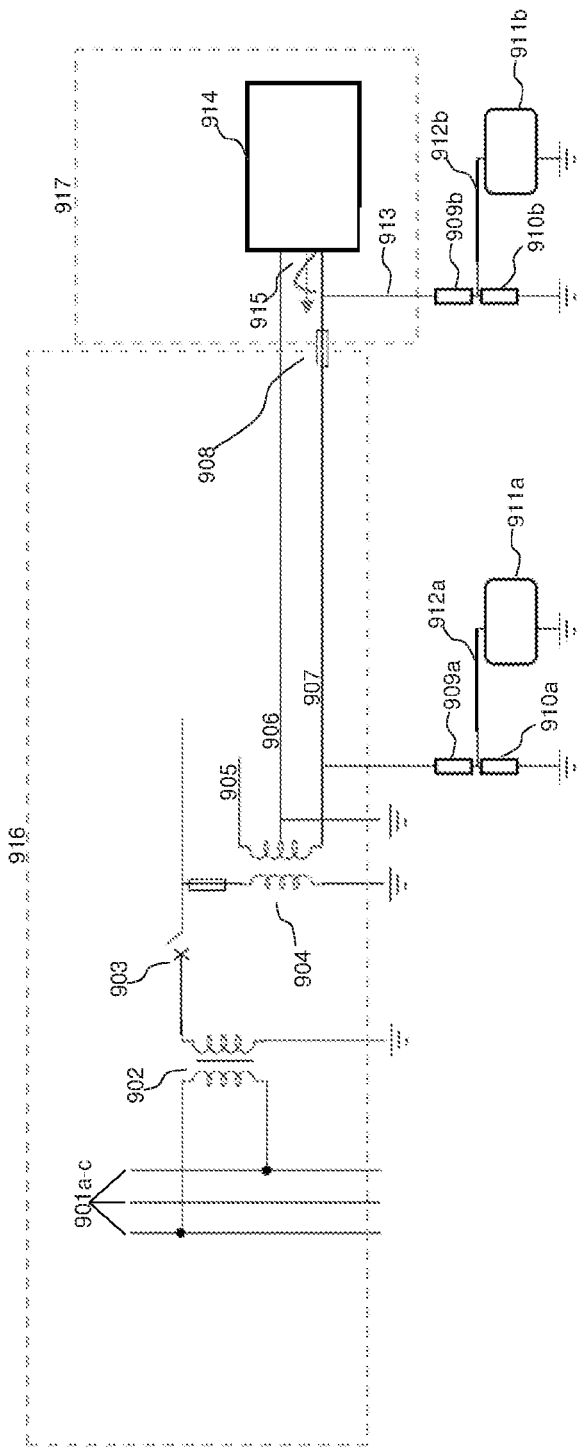
FIG. 9 shows another example circuit schematic of a system for detecting defects in SWER networks, according to some embodiments of the present disclosure.

FIG. 9 shows another example circuit schematic 900 of a system for detecting defects in SWER networks, according to some embodiments of the present disclosure. In some embodiments, circuit 900 can be an alternate embodiment of circuit 500 and can include similar elements and components. For example, circuit 900 can include a supply side section 916 and a customer side section 917. Circuit 900 can include voltage lines 901a-c that provide power to the entire circuit 900. The provided voltage can be stepped down by isolating transformers 902; the circuit 900 can also include a switch or breaker 903 as a safeguard. To provide electrical power to a premises 914, a distribution transformer 904 is configured to further step down the voltage to usable levels 905-907 for appliances and other electronics within the premises 914. A customer fuse box 908 can separate incoming voltage from the SWER distribution network into various circuits.

In addition, similar to the data collection unit 211 of circuit 200 and data collection unit 511 of circuit 500, data collection unit 911a can be installed on the electrical connection between the low-voltage terminal of a distribution transformer 904 and the customer fuse box 908, which is on the supply side 916. Similar to data collection unit 511, data collection unit 911a can be configured to capture broadband signals via channel 912a in a frequency range of 50 Hz to 3 GHz. The data collection unit 911a can also be configured to time-synchronize the captured signals. In some embodiments, the data collection unit 911a can include impedances 909a and 910a. In some embodiments, impedances 909a and 910a can be capacitive or resistive and each can have pre-determined impedance values. Impedances 909a and 910a can be used to reduce the magnitude of the voltage for measuring purposes and create reference voltages. In some embodiments, impedances can also be used as signal filters or attenuators.

In some embodiments, rather than a sensor 513 as in circuit 500, circuit 900 can include a second data collection unit 911b, additional impedances 909b and 910b, and an additional channel 912b. The impedances 909b and 910b can be the same as or similar to impedances 909a and 910a. However, data collection unit 911b can be positioned within the premises 914 on the load side of the electricity meter via connection 913, also known as the customer side 917 of the fuse box 908. In some embodiments, the data collection unit 911b can be the same as or similar to the data collection unit 911a and can be configured to capture broadband signals from the electrical connection, such as in the frequency range of 50 Hz to 3 GHz. Each of data collection units 911a-b can include an ADC to convert analog voltage and/or current measurements to a digital format, time-synchronize the captured measurements, and transmit the signal information to an external server.

In some embodiments, the placement and installation of the data collection units 911a-b can function similar to the data collection unit 511 and sensor 513 of circuit 500 and can allow for the determination of whether the source of a defect HF signal is located on the supply side or the customer side. For example, a defect 915 could occur at a point near or within the premises 914, on the customer side of the circuit 900. The HF signals generated by the defect 915 can travel toward the fuse box 908 and be detected by data collection unit 911b. The HF signals can also travel through the fuse box 908 and be detected by the data collection unit 911a. Each of the data collection units 911a-b can convert all broadband measurements to a digital format using the associated ADCs, time-synchronize the measurements, and extract various parameters from the synchronized signals. Each data collection unit 911a-b can then send the extracted parameters to a central server for analysis. The server can then compare the times of arrival of the HF signals. Because of the placement of the data collection units 911a-b, analysis of the time of arrival to each can be used to determine whether the source is located on the supply side or the customer side. For example, in the case of defect 915, because it is on the customer side 917, the generated HF signals can reach and be detected by the data collection unit 911b prior to data collection unit 911a. This is further described below in FIG. 10. In an alternate embodiment, data collection units 911a and 911b or any pair of units 802 and 810 can communicate directly with each other to exchange signal parameters and perform the analysis of the times of arrival and determine the side on which the defect is located, rather than the server.

Figure 10:
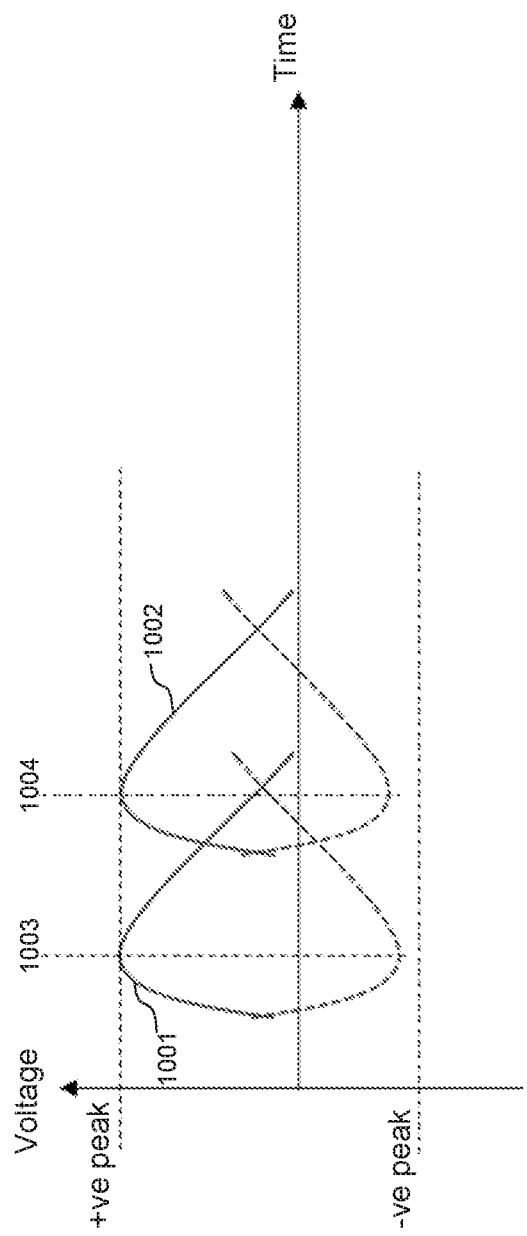
FIG. 10 shows example signals captured by the system of FIG. 8A, according to some embodiments of the present disclosure.

FIG. 10 shows example signals captured by the system of FIG. 8A, according to some embodiments of the present disclosure. The curves 1001 and 1002 and their associated time values 1003 and 1004 that correspond to voltage peaks can be the same as or similar to the curve and time values of FIG. 6. The plot of FIG. 10 can illustrate that the systems 400 and 800 can operate in similar ways to make a determination on whether a defect is located on the supply side or the customer side of a SWER network. Additionally, in some embodiments, the systems of 100, 400, and 800 can be combined into a single system where a server can use TDOA algorithms to determine the location of a defect on the wider SWER network and also determine in the case the defect is located close to a premises whether the it is on the supply side or customer side.

Figure 11:
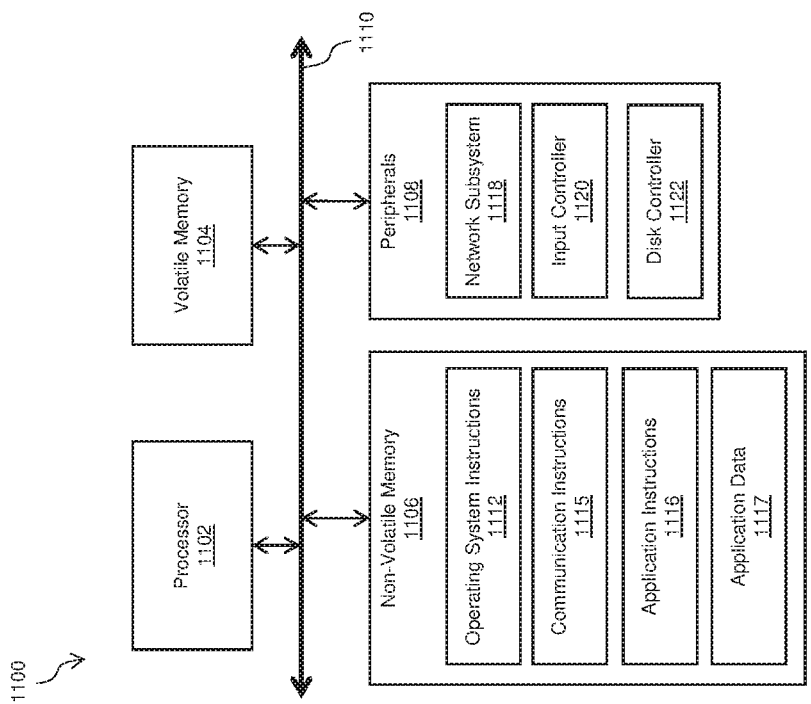
FIG. 11 shows an example server device that may be used within the systems of FIGS. 1A, 4A, and 8A, according to some embodiments of the present disclosure.

FIG. 11 shows an example server device 1100 that may be used within the system of FIG. 1A, according to some embodiments of the present disclosure. Server device 1100 may implement various features and processes as described herein. Server device 1100 may be implemented on any electronic device that runs software applications derived from complied instructions, including without limitation personal computers, servers, smart phones, media players, electronic tablets, game consoles, email devices, etc. In some implementations, server device 1100 may include one or more processors 1102, volatile memory 1104, non-volatile memory 1106, and one or more peripherals 1108. These components may be interconnected by one or more computer buses 1110. In some embodiments, the server device 1100 can include any combination of cloud services and cloud computing resources for processing and storage. In some embodiments, this can include physical servers or virtual servers.

Processor(s) 1102 may use any known processor technology, including but not limited to graphics processors and multi-core processors. Suitable processors for the execution of a program of instructions may include, by way of example, both general and special purpose microprocessors, and the sole processor or one of multiple processors or cores, of any kind of computer. Bus 1110 may be any known internal or external bus technology, including but not limited to ISA, EISA, PCI, PCI Express, USB, Serial ATA, or FireWire. Volatile memory 1104 may include, for example, SDRAM. Processor 1102 may receive instructions and data from a read-only memory or a random access memory or both. Essential elements of a computer may include a processor for executing instructions and one or more memories for storing instructions and data.

Non-volatile memory 1106 may include by way of example semiconductor memory devices, such as EPROM, EEPROM, and flash memory devices; magnetic disks such as internal hard disks and removable disks; magneto-optical disks; and CD-ROM and DVD-ROM disks. Non-volatile memory 1106 may store various computer instructions including operating system instructions 1112, communication instructions 1115, application instructions 1116, and application data 1117. Operating system instructions 1112 may include instructions for implementing an operating system (e.g., Mac OS®, Windows®, or Linux). The operating system may be multi-user, multiprocessing, multitasking, multithreading, real-time, and the like. Communication instructions 1115 may include network communications instructions, for example, software for implementing communication protocols, such as TCP/IP, HTTP, Ethernet, telephony, etc. Application instructions 1116 may include instructions for performing various processes in accordance with the methods for SWER network defect location determination as described herein. For example, application instructions 1116 may include instructions for components 120-122, 424-428, and 822-826 described above in conjunction with FIGS. 1C, 4C, and 8C. Application data 1117 may include data corresponding to similar elements.

Peripherals 1108 may be included within server device 1100 or operatively coupled to communicate with server device 1100. Peripherals 1108 may include, for example, network subsystem 1118, input controller 1120, and disk controller 1122. Network subsystem 1118 may include, for example, an Ethernet of WiFi adapter. Input controller 1120 may be any known input device technology, including but not limited to a keyboard (including a virtual keyboard), mouse, track ball, and touch-sensitive pad or display. Disk controller 1122 may include one or more mass storage devices for storing data files; such devices include magnetic disks, such as internal hard disks and removable disks; magneto-optical disks; and optical disks.

Figure 12:
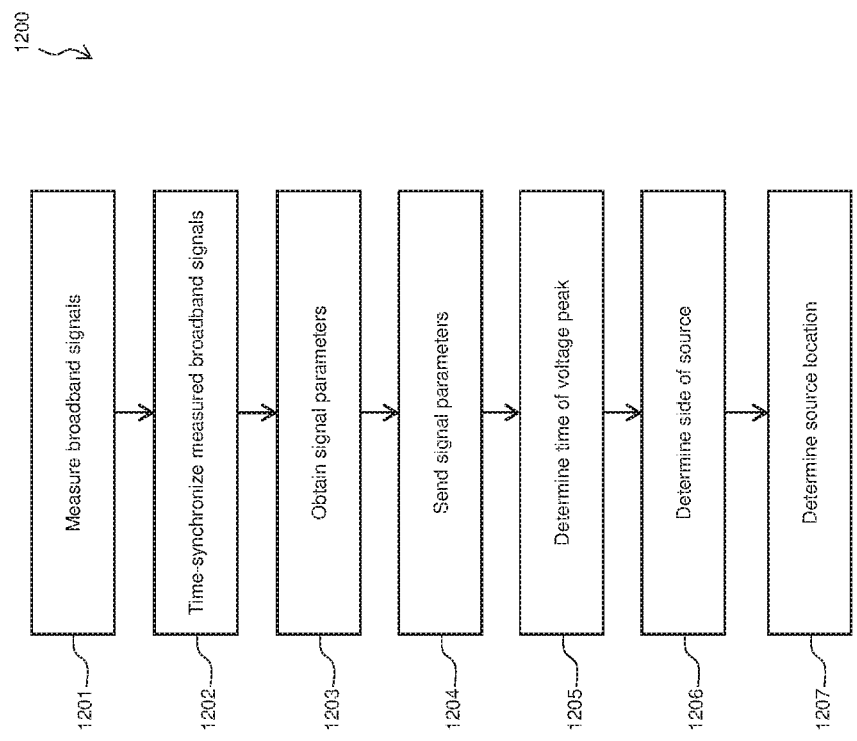
FIG. 12 is another flow diagram showing example processing that may occur to detect defects in SWER networks, according to some embodiments of the present disclosure.

FIG. 12 is another flow diagram showing example processing that may occur to detect defects in SWER networks, according to some embodiments of the present disclosure. In some embodiments, process 1200 can be performed within a system that combines both the fault location determination system of FIG. 1A with the side determination systems of either FIG. 4A or 8A. At block 1201, various data collection units (e.g., data collection units 102, 211, 402, 511, 802, 810, and 911) can measure broadband signals from the network in which they are connected, such as via their associated one or more transducers. At block 1202, each of the data collection units can time-synchronize the measured broadband signals, such as via a GPS module. At block 1203, each of the data collection units can, via a signal analysis module and associated processors, obtain or extract various signal parameters from the measured broadband signals, such as arrival times, peak magnitudes, a frequency-time signal description, and a detection-quality metric. At block 1204, the data collection units can send the extracted signal parameters to a central server for processing. At block 1205, the server can determine the time of the voltage peak and, at block 1206, compare the times of the voltage peaks to determine the side from which a defect occurred. At block 1207, the server can also apply various TDOA algorithms to determine a defect location. In alternate embodiment, the voltage peak and the defect location and the side of defect determination can be performed locally at each of the data collection units using direct communications to exchange data with other data collection units. The location and determination can then be sent to the server.

In some embodiments, the server can also be configured to deliver data and data visualization tools to users via a secure request-based application programming interface (API). For example, users (e.g., network or utility management personnel) may wish to examine measurements in depth. The server can provide a range of data analysis and presentation features via a secure web portal. For example, the server can provide asset defect signature recognition, asset-failure risk estimation, pattern recognition, data visualizations, and a network map-based user interface. In some embodiments, alerts can be generated by the server if signal analysis of defect HF signals indicates certain thresholds have been exceeded.

The described features may be implemented in one or more computer programs that may be executable on a programmable system including at least one programmable processor coupled to receive data and instructions from, and to transmit data and instructions to, a data storage system, at least one input device, and at least one output device. A computer program is a set of instructions that may be used, directly or indirectly, in a computer to perform a certain activity or bring about a certain result. A computer program may be written in any form of programming language (e.g., Objective-C, Java), including compiled or interpreted languages, and it may be deployed in any form, including as a stand-alone program or as a module, component, subroutine, or other unit suitable for use in a computing environment.

Suitable processors for the execution of a program of instructions may include, by way of example, both general and special purpose microprocessors, and the sole processor or one of multiple processors or cores, of any kind of computer. Generally, a processor may receive instructions and data from a read-only memory or a random access memory or both. The essential elements of a computer may include a processor for executing instructions and one or more memories for storing instructions and data. Generally, a computer may also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data may include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory may be supplemented by, or incorporated in, ASICs (application-specific integrated circuits).

To provide for interaction with a user, the features may be implemented on a computer having a display device such as an LED or LCD monitor for displaying information to the user and a keyboard and a pointing device such as a mouse or a trackball by which the user may provide input to the computer.

The features may be implemented in a computer system that includes a back-end component, such as a data server, or that includes a middleware component, such as an application server or an Internet server, or that includes a front-end component, such as a client computer having a graphical user interface or an Internet browser, or any combination thereof. The components of the system may be connected by any form or medium of digital data communication such as a communication network. Examples of communication networks include, e.g., a telephone network, a LAN, a WAN, and the computers and networks forming the Internet.

The computer system may include clients and servers. A client and server may generally be remote from each other and may typically interact through a network. The relationship of client and server may arise by virtue of computer programs running on the respective computers and having a client-server relationship to each other.

One or more features or steps of the disclosed embodiments may be implemented using an API. An API may define one or more parameters that are passed between a calling application and other software code (e.g., an operating system, library routine, function) that provides a service, that provides data, or that performs an operation or a computation.

The API may be implemented as one or more calls in program code that send or receive one or more parameters through a parameter list or other structure based on a call convention defined in an API specification document. A parameter may be a constant, a key, a data structure, an object, an object class, a variable, a data type, a pointer, an array, a list, or another call. API calls and parameters may be implemented in any programming language. The programming language may define the vocabulary and calling convention that a programmer will employ to access functions supporting the API.

In some implementations, an API call may report to an application the capabilities of a device running the application, such as input capability, output capability, processing capability, power capability, communications capability, etc.

While various embodiments have been described above, it should be understood that they have been presented by way of example and not limitation. It will be apparent to persons skilled in the relevant art(s) that various changes in form and detail may be made therein without departing from the spirit and scope. In fact, after reading the above description, it will be apparent to one skilled in the relevant art(s) how to implement alternative embodiments. For example, other steps may be provided, or steps may be eliminated, from the described flows, and other components may be added to, or removed from, the described systems. Accordingly, other implementations are within the scope of the following claims.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. It is important, therefore, that the claims be regarded as including such equivalent constructions insofar as they do not depart from the spirit and scope of the disclosed subject matter.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

Although the disclosed subject matter has been described and illustrated in the foregoing illustrative embodiments, it is understood that the present disclosure has been made only by way of example, and that numerous changes in the details of implementation of the disclosed subject matter may be made without departing from the spirit and scope of the disclosed subject matter.

The invention claimed is:

1. A system for locating defects on a single-wire earth-return (SWER) network comprising:
a network;
a plurality of data collection units, each being positioned at a distribution transformer of the SWER network and configured to:
measure broadband signals originating from a defect along the SWER network;
convert the broadband signals to a digital signal;
extract parameters from the digital signal; and
transmit the extracted parameters over the network; and
a server communicably coupled to the plurality of data collection units via the network configured to:
receive the extracted parameters from each of the plurality of data collection units; and
determine a location of the defect based on the extracted parameters;
wherein each of the plurality of the data collection units is positioned on an electrical connection between a low-voltage terminal of the associated distribution transformers and a fuse box of a customer premises;
wherein each of the plurality of the data collection units is positioned immediately between two or more impedances comprising a voltage divider.

2. The system of claim 1, wherein each of the two or more impedances comprises at least one of a capacitive impedance or a resistive impedance and comprises a pre-determined impedance value.

3. The system of claim 1, wherein the server is configured to use a time difference of arrival (TDOA) algorithm on the extracted parameters from each of the plurality of data collection units.

4. The system of claim 1, wherein the extracted parameters from each of the plurality of data collection units are time-synchronized using a global positioning system (GPS) system.

5. A system for locating defects on a single-wire earth-return (SWER) network comprising:
a network;
a sensor configured to measure broadband signals from a first location between a distribution transformer and a customer fuse box, wherein the signals originate from a defect along the SWER network or in low voltage wiring of a customer premises;

a data collection unit positioned at a second location between the distribution transformer and the fuse box configured to:
  measure broadband signals originating from the defect;
  convert the measured broadband signals from the first and second location to digital signals;
  extract parameters from the digital signals; and
  transmit the extracted parameters over the network; and
a server communicably coupled to the data collection unit via the network configured to:
  receive the extracted parameters from the data collection unit; and
  determine whether a location of the defect is supply-side or customer-side;
wherein either the server or the data collection unit is configured to determine whether the location of the defect is supply-side or customer-side by comparing times of arrival from the digital signals to each of the first and second location.

6. The system of claim 5, wherein the data collection unit comprises a first and second analog-to-digital converter (ADC), the first ADC being configured to convert measured broadband signal from the first location and the second ADC being configured to convert measured broadband signal from the second location.

7. The system of claim 5, wherein the data collection unit is positioned on an electrical connection between a low-voltage terminal of the distribution transformer and the customer fuse box.

8. The system of claim 7, wherein the data collection unit is positioned immediately between two or more impedances comprising a voltage divider.

9. The system of claim 8, wherein each of the two or more impedances comprises at least one of a capacitive impedance or a resistive impedance and comprises a pre-determined impedance value.

10. The system of claim 5, wherein comparing times of arrival from the digital signals comprises:
  determining a maximum voltage of each of the digital signals;
  determining a time value associated with the maximum voltage of each of the digital signals; and
  comparing the time values.

11. A system for locating defects on a single-wire earth-return (SWER) network comprising:
  a network;
  a first data collection unit positioned between a distribution transformer and a customer fuse box and configured to:
    measure broadband signals from a first location originating from a defect along the SWER network or in low voltage wiring of a customer premises;
    convert the measured broadband signals from the first location to a first digital signal;
    extract first parameters from the first digital signal; and
    transmit the extracted first parameters over the network;
  a second data collection unit positioned on a customer side of the customer fuse box and configured to:
    measure broadband signals from a second location originating from the defect;
    convert the measured broadband signals from the second location to a second digital signal;
    extract second parameters from the second digital signal; and
    transmit the extracted second parameters over the network; and
  a server communicably coupled to the first and second data collection unit via the network configured to:
    receive the first and second extracted parameters from the first and second data collection units; and
    determine whether a location of the defect if supply-side or customer-side.

12. The system of claim 11, wherein the first data collection unit is positioned on an electrical connection between a low-voltage terminal of the distribution transformer and the customer fuse box.

13. The system of claim 11, wherein the first and second data collection unit are each positioned immediately between two or more impedances comprising a voltage divider.

14. The system of claim 13, wherein each of the two or more impedances comprises at least one of a capacitive impedance or a resistive impedance and comprises a pre-determined impedance value.

15. The system of claim 11, wherein the first and second digital signals are time-synchronized using a global positioning system (GPS) system.

16. The system of claim 11, wherein the first and second digital signals are time-synchronized using a direct communication link between the first and second data collection units.

17. The system of claim 16, wherein the server is configured to determine whether the location of the defect is supply-side or customer-side by comparing times of arrival from the first digital signal to the first location and the second digital signal to the second location.

* * * * *